(12) United States Patent
Inoue et al.

(10) Patent No.: US 7,648,657 B2
(45) Date of Patent: Jan. 19, 2010

(54) IN SM OXIDE SPUTTERING TARGET (75) Inventors: Kazuyoshi Inoue, Sodegaura (JP); Nobuo Tanaka, Sodegaura (JP); Tokie Tanaka, legal representative, Sodegaura (JP); Shigekazu Tomai, Sodegaura (JP); Masato Matsubara, Sodegaura (JP); Akira Kaijo, Sodegaura (JP); Koki Yano, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 47 days.

(21) Appl. No.: 11/995,640

(22) PCT Filed: Jun. 21, 2006

(86) PCT No.: PCT/JP2006/312412
§ 371 (c)(1),
(2), (4) Date: Jan. 14, 2008

(87) PCT Pub. No.: WO2007/010702
PCT Pub. Date: Jan. 25, 2007

(65) Prior Publication Data
US 2009/0121199 A1    May 14, 2009

(30) Foreign Application Priority Data
Jul. 15, 2005 (JP) .............................. 2005-207513
Sep. 7, 2005 (JP) .............................. 2005-258740

(51) Int. Cl.
*H01B 1/08*    (2006.01)
*C23C 14/08*   (2006.01)

(52) U.S. Cl. ............. 252/521.1; 252/520.1; 204/192.15

(58) Field of Classification Search ............. 252/518.1, 252/520.1, 521.1; 204/192.15, 192.21, 192.25, 204/192.29
See application file for complete search history.

(56) References Cited

U.S. PATENT DOCUMENTS

| 4,160,748 | A | * | 7/1979 | Yodogawa et al. | ....... 252/519.5 |
| 5,972,527 | A |   | 10/1999 | Kaijou et al. | |
| 7,393,600 | B2 | * | 7/2008 | Inoue et al. | ................. 428/697 |
| 2004/0081836 | A1 | | 4/2004 | Inoue et al. | |
| 2006/0234088 | A1 | | 10/2006 | Inoue et al. | |
| 2007/0037402 | A1 | * | 2/2007 | Inoue | ......................... 438/758 |

FOREIGN PATENT DOCUMENTS

| JP | 64-050258 A | 2/1989 |
| JP | 06-234565 A | 8/1994 |
| JP | 07-235219 A | 9/1995 |
| JP | 2004-068054 A | 3/2004 |
| JP | 2004-119272 A | 4/2004 |
| JP | 2004-139780 A | 5/2004 |

(Continued)

*Primary Examiner*—Mark Kopec
(74) *Attorney, Agent, or Firm*—Millen, White, Zelano & Branigan, P.C.

(57) ABSTRACT

A sputtering target which is formed of a sintered body including an oxide main components of which are In and Sm. A sputtering target in which a sintered body of an oxide including In and Sm as main components is doped with at least one element with an atomic valency of positive tetravalency or higher in an amount of 20 at. % or less relative to the total sum of all cation elements.

16 Claims, 6 Drawing Sheets

FOREIGN PATENT DOCUMENTS

| | | |
|---|---|---|
| JP | 2004-146136 A | 5/2004 |
| JP | 2004-158315 A | 6/2004 |
| JP | 2004-240091 A | 8/2004 |
| JP | 2004-294630 A | 10/2004 |
| JP | 2004303477 A | 10/2004 |
| JP | 2004-333882 | 11/2004 |
| JP | 2008001554 A * | 1/2008 |

* cited by examiner

IN SM OXIDE SPUTTERING TARGET

TECHNICAL FIELD

The invention relates to a sputtering target and a method for producing the same.

BACKGROUND

Recently, displays have shown remarkable progress. A variety of displays are briskly introduced to OA apparatuses such as PCs and word processors. These displays each have a structure in which a display element is interposed between transparent conductive films.

Currently, indium tin oxide (ITO) films constitute the mainstream of conductive transparent films since ITO films have excellent transparency, low resistance, improved etching properties, good adhesion to a substrate, as well as other qualities. Generally, ITO films are prepared by sputtering.

However, due to a relatively low moisture resistance, ITO films have such a disadvantage that the electric resistance value thereof increases by moisture. In addition, an ITO target which is used for producing an ITO film by sputtering tends to blacken by reduction. Therefore, changes in the properties of an ITO target with time have become a problem to overcome.

A transparent conductive film formed of indium oxide and zinc oxide which is superior to ITO films in moisture resistance, and has conductivity and light transmittance almost equivalent to that of ITO films, as well as a sputtering target formed of indium oxide and zinc oxide suitable for obtaining such transparent conductive film have been proposed (Patent Documents 1 and 2).

However, the transparent conductive film formed of indium oxide and zinc oxide is very prone to be etched by a weak acid. In addition, this film may be etched by an etching solution for a thin metal film. Therefore, in etching a thin metal film on the transparent conductive film, this transparent conductive film may also be etched. For this reason, this transparent conductive film is not suited for applications where a thin metal film on the transparent conductive film is selectively etched.

On the other hand, a transparent conductive film containing indium oxide and a lanthanide element is known to be useful as an electrode for organic EL devices or semi-transparent/semi-reflective LCDs.

An oxide of a lanthanide element has, however, no conductivity. Therefore, when a target is formed by mixing such an oxide with indium oxide, a target with a low conductivity is obtained. In addition, this target may encounter such problems as occurrence of extraordinary discharge during sputtering or blackening of the target surface. These problems cause the sputtering speed to be lowered.

Patent Document 1: JP-A-6-234565
Patent Document 2: JP-A-7-235219
Patent Document 3: JP-A-2004-68054
Patent Document 4: JP-A-2004-119272
Patent Document 5: JP-A-2004-139780
Patent Document 6: JP-A-2004-146136
Patent Document 7: JP-A-2004-158315
Patent Document 8: JP-A-2004-240091
Patent Document 9: JP-A-2004-294630
Patent Document 10: JP-A-2004-333882

An object of the invention is to provide a sputtering target which has a high conductivity and is free from problems such as extraordinary discharge or blackening of the target surface.

SUMMARY OF THE INVENTION

The invention provides the following sputtering target (hereinafter often to be referred to simply as "target").

1. A sputtering target which is formed of a sintered body comprising an oxide of which the main components are In and Sm.

2. The sputtering target according to 1, wherein the oxide comprises $InSmO_3$ and indium oxide.

3. The sputtering target according to 1 or 2, wherein the atomic ratio of In and Sm, [Sm/(In+Sm)], in the sintered body is 0.001 to 0.8.

4. The sputtering target according to any one of 1 to 3, wherein the sintered body is doped with at least one element with an atomic valency of positive tetravalency or higher in an amount of 20 at. % or less relative to the total sum of all cation elements.

5. The sputtering target according to 4, wherein the element with an atomic valency of positive tetravalency or higher is one or more element selected from the group consisting of Sn, Ge, Ti, Zr, Hf, Nb and Ce.

6. The sputtering target according to 4 or 5 which is formed of a sintered body comprising an oxide comprising $InSmO_3$ and/or $Sn_2Sm_2O_7$.

7. A method for producing the sputtering target according to any one of 1 to 3 which comprises the steps of:
   mixing an indium compound and a samarium compound to obtain a mixture;
   molding the mixture to obtain a molded article; and
   sintering the molded article to obtain a sintered body.

8. A method for producing the sputtering target according to any one of 4 to 6 which comprises the steps of:
   adding at least one element with an atomic valency of positive tetravalency or higher to an indium compound and a samarium compound to obtain a mixture;
   molding the mixture to obtain a molded article; and
   sintering the molded article to obtain a sintered body.

According to the invention, a sputtering target which has a high conductivity and is free from problems such as extraordinary discharge and target surface blackening irrespective of the presence of samarium (lanthanide element) can be provided.

BEST MODE FOR CARRYING OUT THE INVENTION

A first target of the invention is formed of a sintered body containing an oxide, the main components of which are In and Sm (hereinafter referred to as "target I").

The oxide comprising In and Sm as main components can contain indium oxide and samarium oxide, which are raw materials, as well as an indium-samarium oxide such as $InSmO_3$.

The sintered body contains an oxide comprising In and Sm as the main components preferably in an amount of 1 wt % or more, more preferably 3 wt % or more. If the content of the oxide comprising In and Sm as the main component is less than 1 wt %, conductivity may be lowered.

Preferred examples of the oxide constituting the sintered body include the following:

(a) $InSmO_3$ (b) A mixture of $InSmO_3$ and $In_2O_3$ (c) A mixture of $InSmO_3$ and $Sm_2O_3$ Here, $In_2O_3$ and $Sm_2O_3$ in (b) and (c) may have either a specific crystalline structure or an amorphous structure.

Of these, a sintered body comprising (b) (mixture of $InSmO_3$ and $In_2O_3$) is preferable.

In target I, the atomic ratio of In and Sm, (Sm/(In+Sm), is preferably 0.001 to 0.8, more preferably 0.01 to 0.20, and particularly preferably 0.01 to 0.1. If the atomic ratio is less than 0.001, durability (acid resistance) of the transparent conductive film obtained from the target may be lowered. If the atomic ratio exceeds 0.8, the conductivity of the transparent conductive film may be lowered or lost.

The above atomic ratio of In and Sm can be obtained by adjusting the mixing ratio of an indium compound and an samarium compound before sintering. Probably, according to the mixing ratio before sintering, an indium-samarium oxide such as $InSmO_3$ which is formed of an indium oxide and a samarium oxide in the chemical stoichiometric ratio is generated, and remaining indium oxide and samarium oxide are present as a crystalline substance, an amorphous substance or the like.

The relative density of the sintered body constituting target I is preferably 70% or more, more preferably 85% or more, still more preferably 90% or more. If the density of the sintered body is less than 70%, the film-forming speed may be lowered, and the target and film obtained therefrom tends to blacken. To obtain a sintered body having a high density, it is preferred that sintering be performed after molding under cold isostatic pressure (CIP) or under hot isostatic pressure (HIP) or the like.

As mentioned above, target I of the invention is formed of a sintered body of an indium-samarium oxide. Target I formed of this sintered body is excellent in conductivity and acid resistance, and hence suitable as a sputtering target for obtaining transparent conductive films for a variety of applications, including liquid crystal display devices, EL display devices and solar cells. As compared with a target formed of $In_2O_3$ and $Sm_2O_3$, target I exhibits higher conductivity and keeps stable sputtering status without extraordinary discharge and target surface blackening. By using this target, it is possible to obtain a transparent conductive film which has conductivity and light transmittance equivalent to those of an ITO film and is suitable for use as an electrode for organic EL devices or semi-transparent/semi-reflective LCDs.

Although target I can be produced by various methods, it is preferred that target I be produced by the method of the invention, which is described later.

A second target of the invention is a target in which the sintered body constituting target I is doped with at least one element with an atomic valency of positive tetravalency or higher in an amount of 20 at. % or less relative to the total sum of all cation elements (hereinafter referred to as "target II").

In target II, as examples of the element having an atomic valency of positive tetravalency or higher (hereinafter often referred to as "doping element"), Sn, Ge, Ti, Zr, Hf, Ce, Nb or the like can be exemplified. Of these, Sn is preferable. The term "total sum of all cation elements" is defined as the total amount of cation elements contained in the sintered body.

The composition, density or the like of the indium-samarium oxide in target II is the same as that of target I, and hence, explanation is omitted here.

The reason for limiting the ratio of the doping element to 20 at. % or less in target II is mentioned below. If the ratio of the doping element exceeds 20 at. %, a transparent conductive film obtained from this target may have lowered conductivity due to carrier scattering by ions. The amount of the doping element is preferably 10 at. % or less.

Target II includes a target that is formed of a sintered body of an oxide containing $InSmO_3$ and/or $Sn_2Sm_2O_7$.

This oxide may also contain $In_2O_3$, $Sm_2O_3$, $SnO_2$ or the like in addition to the oxides as mentioned above.

The preferable atomic ratio of In and Sm, (Sm/(In+Sm), is the same as that in the case of target I.

Since an element having an atomic valency of positive tetravalency or higher is doped, target II provides a transparent conductive film having conductivity higher than that of a transparent conductive film obtained by target I.

The oxide constituting the sintered body of target II may include an oxide of a doping element in addition to the oxides contained in target I.

As in the case of target I, target II of the invention is suitable as a sputtering target for obtaining transparent conductive films for a variety of applications including liquid crystal display devices, EL display devices, solar cells, and the like. When this target is used, high target conductivity can be attained and a stable sputtering status which is free from extraordinary discharge and target surface blackening can be maintained. As a result, a transparent conductive film having conductivity and light transmittance equivalent to that of ITO films can be obtained.

Although target II can be produced by various methods, it is preferred that target II be produced by the method of the invention II described later.

A first method for producing a target of the invention comprises the steps of mixing an indium compound and a samarium compound to obtain a mixture; molding the mixture to obtain a molded article; and sintering the molded article to obtain a sintered body of an oxide containing In and Sm as main components (hereinafter referred to as "method I").

An indium compound and a samarium compound used in method I may be one which becomes an oxide or an oxide after firing (oxide precursor). Examples of the indium oxide precursor and the samarium oxide precursor include sulfides, sulfates, nitrates, halides (chloride, bromide, or the like), carbonates, organic acid salts (acetate, propionate, naphthenate, or the like), alkoxides (methoxide, ethoxide, or the like), organic metal complexes (acetylacetonate or the like) of indium and samarium.

Of these, nitrates, organic acid salts, alkoxides, and organic metal complexes are preferable for full thermal decomposition at lower temperatures with no remaining impurities.

In method I, an indium compound and a samarium compound are mixed at first to obtain a mixture. It is preferred that this step be performed by a solution method (co-precipitation method) or a physical mixing method. The physical mixing method described below is more preferable.

The physical mixing method can be applied to both cases, i.e. a case where the indium compound is an indium oxide or its precursor (regardless of being soluble or hardly-soluble in water), and a case where the samarium compound is a samarium oxide or its precursor (regardless of being soluble or hardly-soluble in water). According to this method, an indium compound and a samarium compound are put in a mixing apparatus such as a ball mill, a jet mill, a pearl mill, and a bead mill, and these compounds are then mixed homogeneously. The mixing time is preferably 1 to 200 hours. If mixing is performed for less than 1 hour, it may be difficult to obtain a homogeneous mixture. A mixing time exceeding 200 hours may result in lowered productivity. It is particularly preferable to perform mixing for 3 to 120 hours.

In method I, after mixing an indium compound and a samarium compound, the resulting mixture is preferably subjected to a calcination step before a molding step.

Although the step of calcinating the mixture of an indium compound and a samarium compound may vary depending on temperature and time, it is preferred that calcination be conducted at 500 to 1200° C. for 1 to 100 hours. If calcination is conducted at temperatures lower than 50° C. or for a period of less than 1 hour, thermal decomposition or reaction of an indium compound and a samarium compound is insufficient. When calcination is conducted at temperatures higher than 1200° C. or for a period longer than 100 hours, particles are sintered to be large. It is particularly preferred that calcination be performed at 800 to 1200° C. for 2 to 50 hours.

According to method I of the invention, after performing calcination as mentioned above, it is preferred that the resulting calcinated product be pulverized. If need arises, the calcinated product may be subjected to reduction treatment before or after pulverization.

It is preferred that pulverization of the calcinated product be performed by means of a ball mill, a roll mill, a pearl mill, a jet mill, a bead mill or the like in such a manner that the particle size becomes 0.01 to 1.0 μm. If the particle size is less than 0.01 μm, the particles tend to agglomerate to make handling difficult. In addition, it is hard to obtain a dense sintered body. On the other hand, when the particle size exceeds 1.0 μm, there may be a case where a dense sintered body cannot be obtained readily. Repeated calcination and pulverization is preferable for the formation of a sintered body with a uniform composition.

As for the method for reduction when the reduction treatment is conducted, reduction with a reductive gas, firing under vacuum, reduction with an inert gas, or the like can be used. When reduction is performed with a reductive gas, hydrogen, methane, CO, a mixed gas of these gases with oxygen, or the like can be used as the reductive gas. In the case of reduction by firing in an inert gas, nitrogen, argon, a mixed gas of these gases with oxygen, or the like can be used as the reductive gas. The reduction temperature is preferably 100 to 800° C. If reduction is performed at temperatures lower than 100° C., it may be difficult to perform reduction sufficiently. When the reduction temperature exceeds 800° C., zinc oxide may evaporate to cause the composition to be changed. It is particularly preferred that the reduction be performed at 200 to 800° C. The reduction time, which depends on the reduction temperature, is preferably 0.01 to 10 hours. If the reduction is conducted for a period shorter than 0.01 hour, it may be difficult to perform reduction sufficiently. A reduction time exceeding 10 hours is not preferable from an economical viewpoint. It is particularly preferred that the reduction be conducted for 0.05 to 5 hours.

When an oxide is used as the starting material, the above-mentioned steps of calcination and reduction may be omitted.

In method I of the invention, a mixture or a calcinated product obtained in the previous step is then sintered.

Molding of the mixture or the calcinated powder is conducted by die molding, casing molding, injection molding, or the like. To obtain a sintered body with a high sintering density, it is preferred that CIP (cold isostatic pressure) molding or the like be performed, followed by sintering, which is described later. The shape of a molded article may be any shape which is suitable for use as a target. For molding, it is possible to use a molding aid such as PVA (polyvinyl alcohol), MC (methyl cellulose), polywax, oleic acid or the like.

Sintering after molding is performed by firing under normal pressure, firing under a hot isostatic pressure (HIP), or the like. The sintering may be performed at temperatures of not less than the temperature which causes an indium compound and a samarium compound to thermally decompose to become an oxide. Generally, a sintering temperature of 800 to 1700° C. is preferable. A sintering temperature exceeding 1700° C. is not preferable since a samarium oxide and an indium oxide sublime to cause a change in composition. It is particularly preferred that sintering be performed at 1200 to 1600° C. Sintering time depends on sintering temperature, but is preferably 1 to 50 hours, more preferably 2 to 10 hours. Sintering may be conducted under a reducing atmosphere. As the reducing atmosphere, an atmosphere of a reducing gas such as $H_2$, methane, and CO, and an atmosphere of an inert gas such as Ar and $N_2$ can be given. In this case, samarium oxide and indium oxide tend to evaporate. To prevent this, it is desirable to perform pressure sintering such as HIP sintering.

By conducting sintering in the above-mentioned manner, intended target I formed of a sintered body of an oxide containing In and Sm as main components can be obtained.

A second method for producing a target of the invention comprises the steps of adding at least one compound of an element with an atomic valency of positive tetravalency or higher to an indium compound and a samarium compound to obtain a mixture; and molding the mixture to obtain a molded article; and sintering the molded article to obtain a sintered body which is doped with at least one element with an atomic valency of positive tetravalency or higher in an amount of 20 at. % or less relative to the total sum of all cation elements (hereinafter referred to as method II).

Method II is a method suitable for obtaining target II. Method II differs from method I only in the addition of at least one compound of an element with an atomic valency of positive tetravalency or higher (Sn compounds, Ge compounds, Ti compounds, Zr compounds, Hf compounds, Ce compounds, Nb compounds, for example) to an indium compound and a samarium compound to obtain a mixture. Other steps are similar to those of method I.

As examples of the tin compound used in method II, a tin oxide or a tin oxide precursor which becomes a tin oxide after firing can be given. Specific examples include tin acetate, tin oxalate, 2-ethylhexyl tin, tin alkoxides such as dimethoxy tin, diethoxy tin, dipropoxy tin, tetramethoxy tin, tetraethoxy tin, tetrapropoxy tin and tetrabutoxy tin, tin chloride, tin fluoride, tin nitride, and tin sulfate.

As examples of the germanium compound, a germanium oxide or its precursor can be given. Specific examples include germanium chloride, germanium alkoxides such as tetramethoxy germanium, tetraethoxy germanium, tetrapropoxy germanium and tetrabutoxy germanium, germanium sulfate, germanium nitrate, and germanium oxalate.

As examples of the titanium compound, titanium oxide or its precursor can be given. Specific examples include titanium chloride, titanium fluoride, titanium alkoxides such as tetramethoxy titanium, tetraethoxy titanium, tetrapropoxy titanium and tetrabutoxy titanium, titanium sulfate, and titanium hydroxide.

As examples of the zirconium compound, zirconium oxide or its precursor can be given. Specific examples include zirconium chloride, tetramethoxy zirconium, zirconium alkoxides such as tetraethoxy zirconium, tetrapropoxy zirconium and tetrabutoxy zirconium, zirconium sulfate, zirconium nitrate, and zirconium oxalate.

As examples of the hafnium compound, hafnium oxide or its precursor can be given. Specific examples include hafnium chloride, hafnium alkoxides such as tetramethoxy hafnium, tetraethoxy hafnium, tetrapropxy hafnium and tetrabutoxy hafnium, hafnium sulfate, hafnium nitrate, and hafnium oxalate.

As examples of the cerium compound, cerium oxide or its precursor can be given. Specific examples include cerium chloride, cerium alkoxides such as tetramethoxy cerium, tetraethoxy cerium, tetrapropoxy cerium and tetrabutoxy cerium, cerium sulfate, cerium nitrate, and cerium oxalate.

As examples of the niobium compound, niobium oxide or its precursor can be given. Specific examples include niobium chloride, niobium alkoxides such as tetramethoxy niobium, tetraethoxy niobium, tetrapropoxy niobium and tetrabutoxy niobium, niobium sulfate, niobium nitrate, and niobium oxalate.

It is preferred that the amount of a compound of an element with an atomic valency of positive tetravalency or higher as the doping material (e.g. tin compounds, germanium compounds, titanium compounds, zirconium compounds, hafnium compounds and niobium compounds) be determined appropriately such that the ratio of the doping element (Sn, Ge, Ti, Zr, Hf, Nb or the like) in a target which is finally obtained becomes 20 at. % or less relative to the total sum of all cation elements, taking into account evaporation or loss of each component during the production process. If the ratio of the doping element finally exceeds 20 at. %, conductivity of the target, and the resultant transparent conductive film may be lowered due to the scattering of ions.

Of these doping elements, Sn compounds are preferably used. In this case, $Sn_2Sm_2O_7$ can be generated in the target. In addition, if the atomic ratio of added Sn is larger than the atomic ratio of Sm, relative to all cations in the target, the resistivity of the target itself can be more preferably decreased.

According to method II, intended target II in which the sintered body is doped with a specific amount of an element with an atomic valency of positive tetravalency or higher can be obtained.

The transparent conductive film can be obtained by sputtering the above-mentioned sputtering targets I and II. The resulting transparent conductive film is normally amorphous. However, the transparent conductive film can be crystallized by heat treatment to have a low resistance.

The transparent conductive film is preferably amorphous and has an atomic ratio of In and Sm, [Sm/(In+Sm)], of 0.001 to 0.8. A more preferable atomic ratio is 0.005 to 0.2.

When an element with an atomic valency of positive tetravalency or higher is doped, the transparent conductive film of the invention has an atomic ratio of In and Sm, [Sm/(In+Sm)], of 0.001 to 0.2, more preferably 0.01 to 0.2. The atomic ratio of the element to the total of the element, indium and samarium (i.e. element/(In+Sm+element)) is 0.01 to 0.2, preferably 0.02 to 0.1.

EXAMPLES

The properties of targets and transparent conductive films obtained in Examples and Comparative Examples were measured as follows.

(1) Relative Density

The theoretical density was calculated from the densities of raw materials used and the mixing ratio of the raw materials. The ratio of the measured density to the theoretical density was defined as the relative density.

(2) Doping Element Concentration

The amount of each element was measured by an ICP measurement.

(3) Bulk Resistance of Target and Specific Resistance of Transparent Conductive Film The bulk resistance of the target or the specific resistance of the transparent conductive film were measured and calculated by the four probe method using a Lorester (manufactured by Mitsubishi Chemical Corporation).

(4) Transmittance to Visible Light

The transmittance at a wavelength of 550 nm was measured by means of a microspectrophotometer using air as reference.

Example 1

(1) Production of Target I 450 g of indium oxide and 550 g of samarium oxide were dispersed in ion exchange water. The dispersion was pulverized and mixed for about 5 hours by means of a bead mill.

The resulting slurry was dried and granulated by means of a spray drier. The powder was then placed in a mold with a diameter of 10 mm, and subjected to preliminary molding at a pressure of 100 kg/cm$^2$ using a mold pressing machine. Subsequently, the molded product was compacted at a pressure of 4 t/cm$^2$, by means of a cold isostatic pressing machine, sintered at 1300° C. for 5 hours, thereby to obtain a sintered body.

Figure 1:
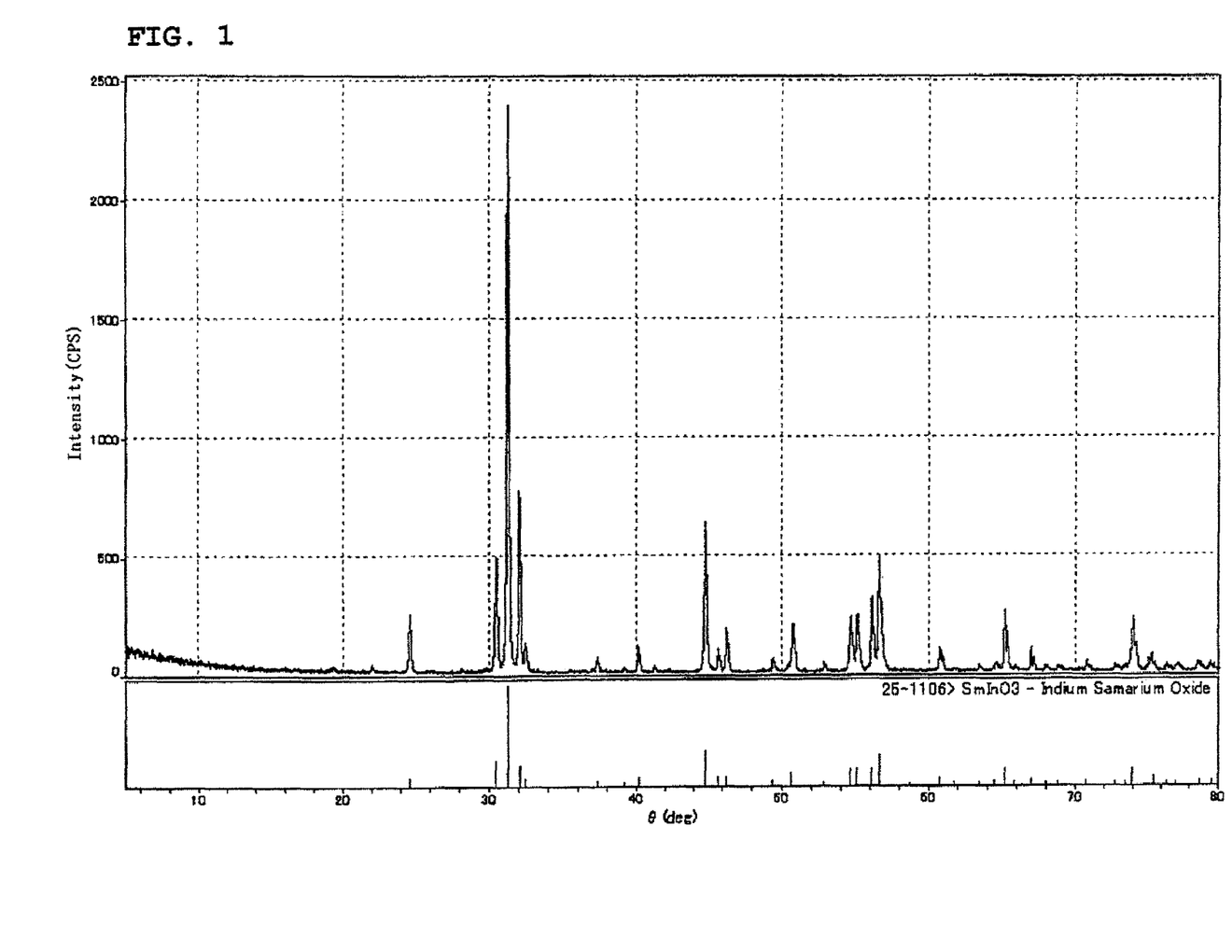
FIG. 1 is an X-ray diffraction pattern of target I obtained in Example 1.

As a result of an X-ray diffraction analysis, it was confirmed that the sintered body was target I formed of an oxide containing In and Sm as main components (FIG. 1).

As a result of an ICP (Inductively Coupled Plasma) analysis, the atomic ratio was as follows: Sm/(In+Sm)=0.5 (In/(In+Sm)=0.5).

The dispersion condition of In and Sm was examined by an in-plane element distribution analysis by means of an EPMA (Electron Probe Micro Analyzer). In and Sm were dispersed substantially homogeneously. The relative density of the sintered body was 95%.

Example 2

(1) Production of Target I

A sintered body was obtained in the same manner as in Example 1, except that 850 g of indium oxide and 150 g of samarium oxide were used.

Figure 2:
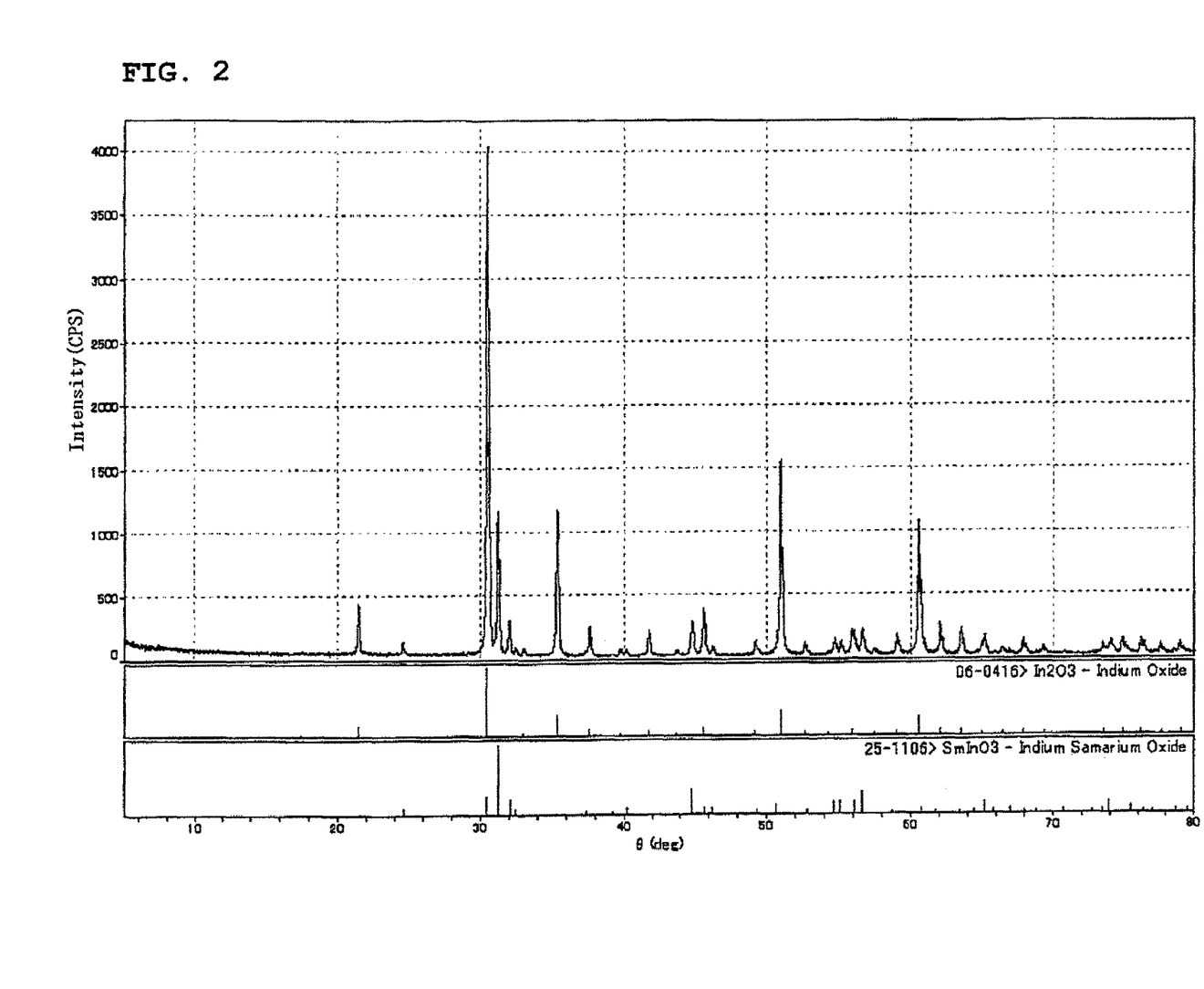
FIG. 2 is an X-ray diffraction pattern of target I obtained in Example 2.

An X-ray diffraction analysis confirmed that the resulting sintered body was target I formed of $InSmO_3$ and indium oxide (FIG. 2).

As a result of an ICP analysis, the atomic ratio was as follows: $Sm/(In+Sm)=0.12$.

The dispersion condition of In and Sm was examined by an EPMA measurement. In and Sm each had a substantially uniform particle size. The relative density of the sintered body was 95%.

Example 3

(1) Production of Target II 900 g of indium oxide, 70 g of tin oxide, and 30 g of samarium oxide were placed in a polyimide-made pot (volume: 10 L) together with alumina balls with a diameter of 2 mm, followed by the addition of ethanol. The resultant was pulverized and mixed for 10 hours by means of a planetary ball mill.

Figure 3:
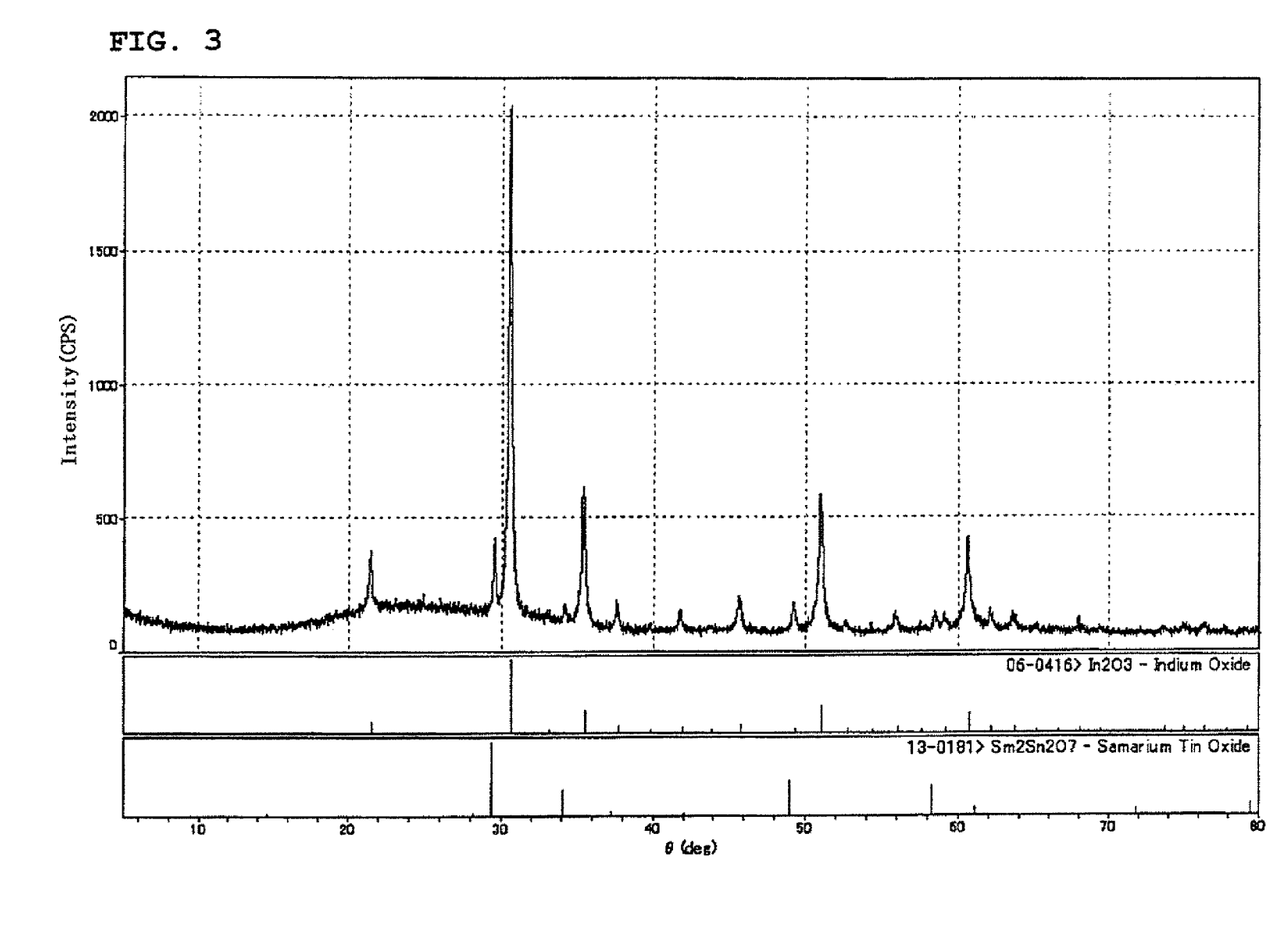
FIG. 3 is an X-ray diffraction pattern of target II obtained in Example 3.

The powder was placed in a mold with a diameter of 4 inches, and subjected to a preliminary molding using a mold pressing machine at a pressure of 100 kg/cm². The molded product was subsequently compacted at a pressure of 4 t/cm² by means of a cold isostatic pressing machine, fired at 1300° C. and 1000 kgf/cm² for 3 hours by hot isostatic pressing to obtain a sintered body. An X-ray diffraction analysis revealed that the resulting sintered body was formed of $Sn_2Sm_2O_7$ and indium oxide (FIG. 3).

As a result of an ICP analysis, the atomic ratio was as follows: $Sm/(In+Sm)=0.026$.

Figure 4:
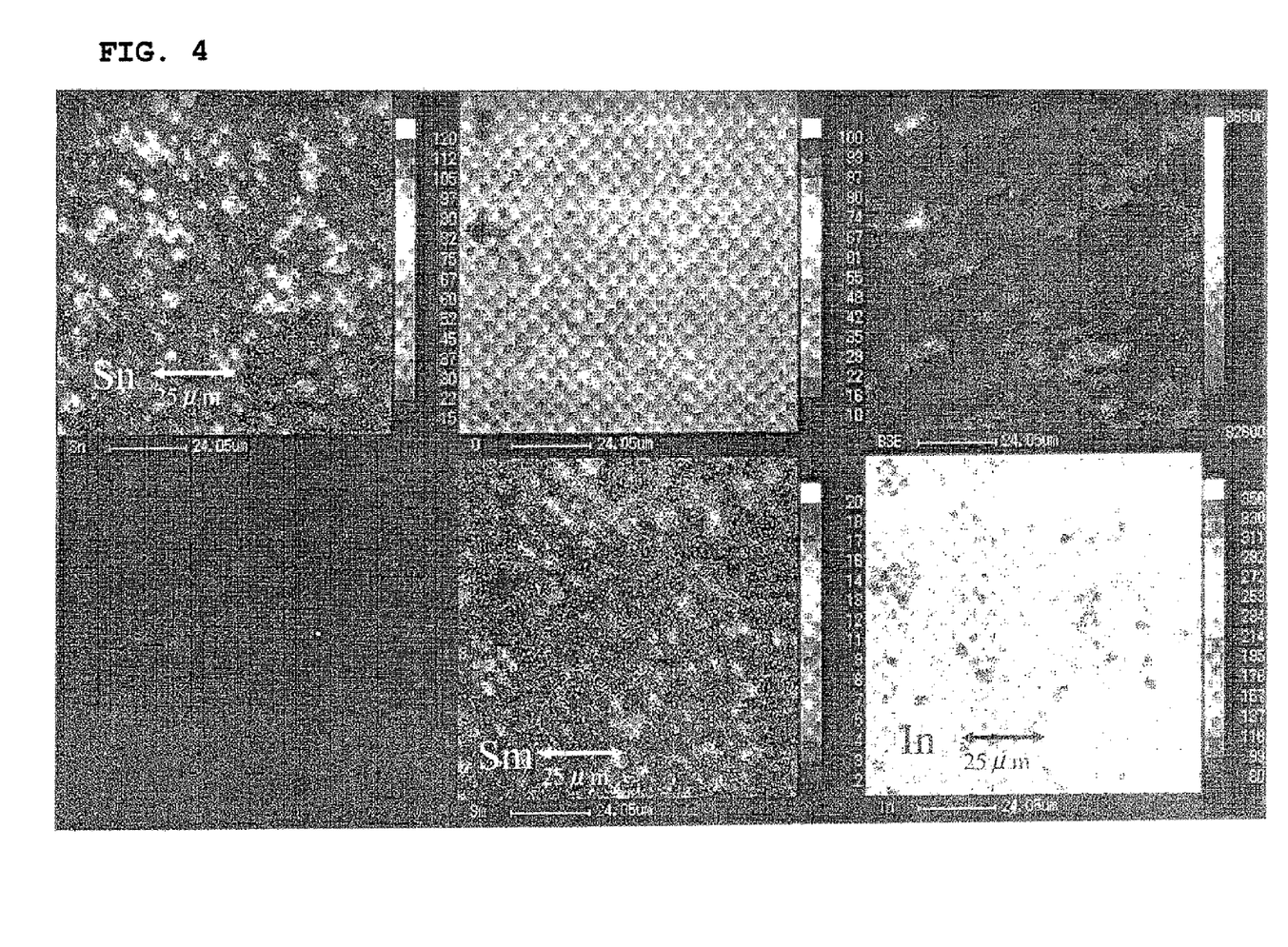
FIG. 4 is a view showing an in-plane distribution measured by an EPMA of target II obtained in Example 3.

The dispersion condition of In, Sn and Sm was examined by an in-plane element distribution analysis by means of an EPMA, and it was found that Sn and Sm each had a particle size of 10 μm or less, and were dispersed homogeneously in the target. The relative density of the sintered body was 95% (FIG. 4).

(2) Production of Transparent Conductive Film

Using the sintered body obtained in (1) above was used as a sputtering target, a transparent conductive film was produced according to the following method.

A substrate (a glass plate with a thickness of 1.1 mm) was placed in an RF magnetron sputtering device. The pressure inside a vacuum chamber was reduced to $5\times10^{-4}$ Pa or less. Thereafter, argon gas was introduced into the chamber to $3\times10^{-1}$ Pa. Sputtering was conducted (output: 100 W, substrate temperature: room temperature), thereby to form a transparent conductive film with a thickness of 100 nm.

An X-ray diffraction analysis confirmed that the resultant transparent conductive film was amorphous. As a result of an ICP analysis, the atomic ratio was as follows: $Sm/(In+Sm)=0.026$, $In/(In+Sn+Sm)=0.910$, $Sn/(In+Sn+Sm)=0.065$, $Sm/(In+Sn+Sm)=0.025$.

Figure 5:
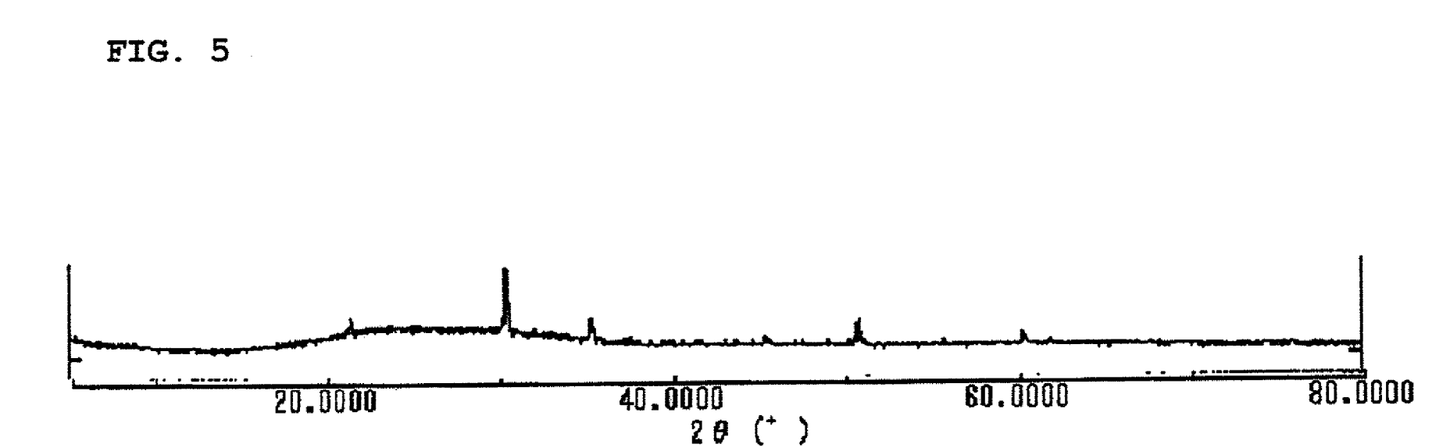
FIG. 5 is an X-ray diffraction pattern of a transparent conductive film after heat treatment obtained in Example 3.

The resulting transparent conductive film had a specific resistance of 480 μΩcm and a transmittance to visible light of 86.2%. The specific resistance was low of 485 μΩcm even after a 1000 hour-long humidity test at 40° C. with a relative humidity of 90%. The resulting transparent conductive film was confirmed to be excellent in moisture resistance. After the heat treatment at 300° C. in atmosphere for one hour, the specific resistance was lowered to 240 μΩcm. The X-ray diffraction analysis showed a peak derived from indium oxide, indicating that the transparent conductive film was crystalline (FIG. 5).

Example 4

(1) Production of Target II

A sintered body was obtained in the same manner as in Example 3, except that 850 g of indium oxide, 50 g of tin oxide, and 100 g of samarium oxide were used.

Figure 6:
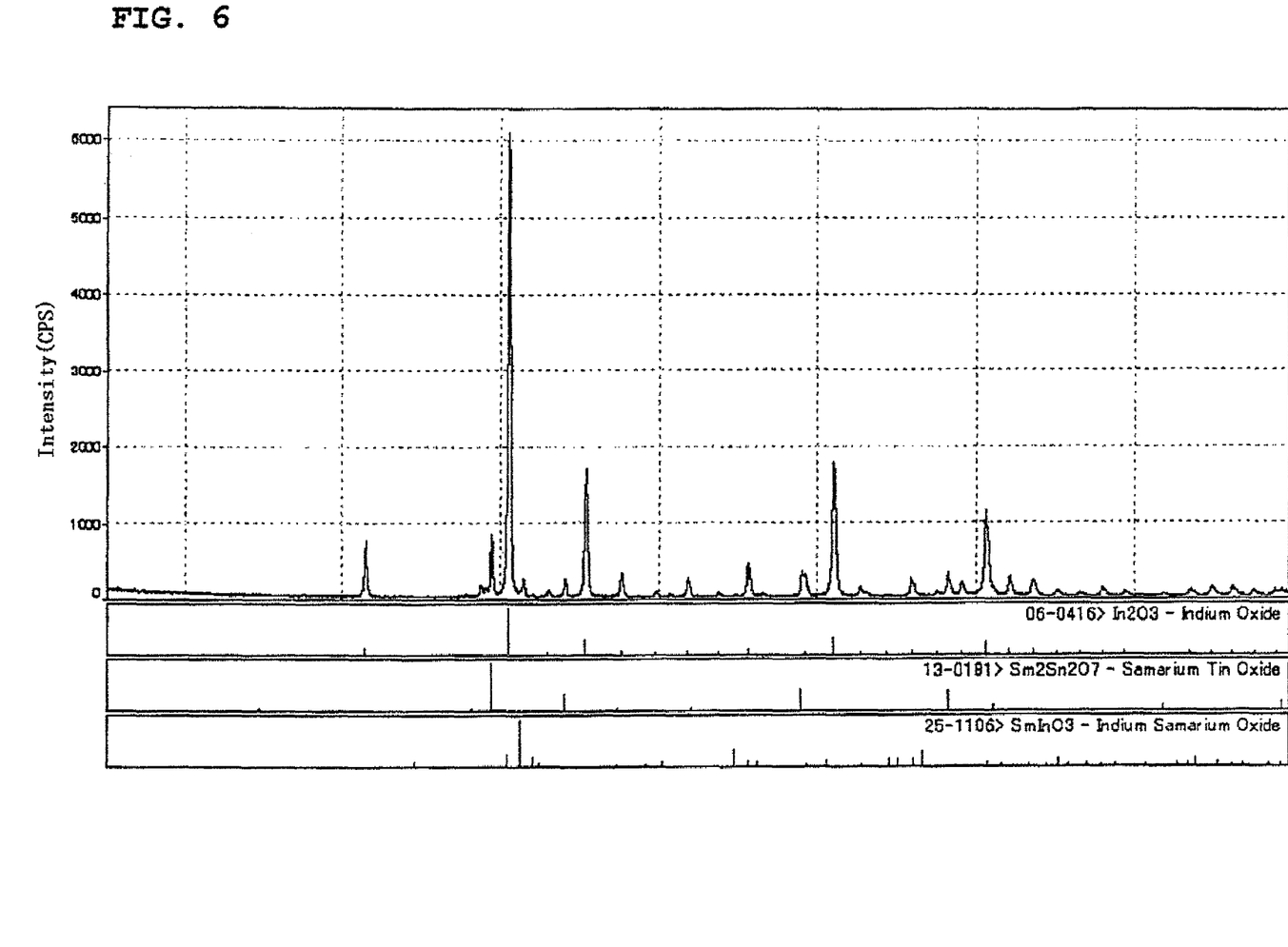
FIG. 6 is an X-ray diffraction pattern of target II obtained in Example 4.

The results of the X-ray diffraction analysis confirmed that the sintered body was formed of $Sn_2Sm_2O_7$, $InSmO_3$, and indium oxide (FIG. 6).

As a result of an ICP analysis, the atomic ratio was as follows: $Sm/(In+Sm)=0.086$.

The dispersion condition of In and Sm was examined by an in-plane element distribution analysis by an EPMA measurement, and it was found that Sn and Sm each had a particle size of 10 μm or less, and were dispersed substantially homogeneously in the target. The relative density of the sintered body was found to be 95%.

(2) Production of Transparent Conductive Film

A transparent conductive film was formed in the same manner as in Example 3, except that the sintered body obtained in (1) above was used as a sputtering target.

An X-ray diffraction analysis confirmed that the resulting transparent conductive film was amorphous. As a result of an ICP analysis, the atomic ratio was as follows: $Sm/(In+Sm)=0.086$, $In/(In+Sn+Sm)=0.87$, $Sn/(In+Sn+Sm)=0.047$, $Sm/(In+Sn+Sm)=0.083$.

The resulting transparent conductive film had a specific resistance of 435 μΩcm and a transmittance to visible light of 86.8%. The specific resistance was low of 462 μΩcm even after a 1000 hour-long humidity test at 40° C. with a relative humidity of 90%. The resulting transparent conductive film was found to be excellent in moisture resistance.

The transparent conductive film immediately after the film formation was placed in a vacuum chamber. After reducing the pressure to $5'10^{-4}$ Pa or less, the transparent conductive film was subjected to heat treatment at 300° C. for one hour in an atmosphere of argon of 0.3 Pa. As a result of X-ray diffraction analysis of the film, indium oxide crystals were observed, which confirmed that the resulting film was crystalline. After the heat treatment, the specific resistance of the transparent conductive film was decreased to 215 μΩcm.

Example 5

(1) Production of Target II

A sintered body was obtained in the same manner as in Example 3, except that 900 g of indium oxide, 50 g of tin oxide, and 50 g of samarium oxide were used.

The results of X-ray diffraction analysis showed that the resulting sintered body was formed of $Sn_2Sm_2O_7$ and indium oxide.

As a result of an ICP analysis, the atomic ratio was as follows: $Sm/(In+Sm)=0.042$.

The dispersion state of In and Sm was examined by an EPMA measurement, and it was found that the particles of substantially uniform size were dispersed homogeneously. The relative density of the sintered body was 95%.

(2) Production of Transparent Conductive Film

A transparent conductive film was formed in the same manner as in Example 3, except that the sintered body obtained in (1) above was used as a sputtering target.

An X-ray diffraction analysis revealed that the resulting transparent conductive film was amorphous. As a result of an ICP analysis, the atomic ratio was as follows: Sm/(In+Sm) =0.042, In/(In+Sn+Sm)=0.91, Sn/(In+Sn+Sm)=0.05, Sm/(In+Sn+Sm)=0.04.

The resulting transparent conductive film had a specific resistance of 486 μΩcm and a transmittance to visible light of 86.4%. The specific resistance was low of 514 μΩcm even after a 1000 hour-long humidity test at 40° C. with a relative humidity of 90%. The resulting transparent conductive film was confirmed to be excellent in moisture resistance.

The transparent conductive film immediately after the film formation was subjected to heat treatment as in Example 4. As a result of X-ray diffraction analysis, indium oxide crystals were observed, which confirmed that the resulting film was crystalline. After the heat treatment, the specific resistance of the transparent conductive film was decreased to 247 μΩcm.

Example 6

(1) Production of Target II

A sintered body was obtained in the same manner as in Example 3, except that 900 g of indium oxide, 90 g of tin oxide, and 10 g of samarium oxide were used.

An X-ray diffraction analysis revealed that the resulting sintered body was formed of $Sn_2Sm_2O_7$ microcrystals and indium oxide.

As a result of an ICP analysis, the atomic ratio was as follows: Sm/(In+Sm)=0.009

The dispersion state of In and Sm was examined by an EPMA measurement, and it was found that the particles of substantially uniform size were dispersed homogenously. The relative density of the sintered body was 95%.

(2) Production of Transparent Conductive Film

A transparent conductive film was produced in the same manner as in Example 3, except that the sintered body obtained in (1) above was used as a sputtering target.

An X-ray diffraction analysis revealed that the resulting transparent conductive film was amorphous. As a result of an ICP analysis, the atomic ratio was as follows: Sm/(In+Sm) =0.0088, In/(In+Sn+Sm)=0.908, Sn/(In+Sn+Sm)=0.084, Sm/(In+Sn+Sm)=0.008

The resulting transparent conductive film had a specific resistance of 386 μΩcm and a transmittance to visible light of 87.8%. The specific resistance was low of 432 μΩcm even after a 1000 hour-long humidity test at 40° C. with a relative humidity of 90%. The resulting transparent conductive film was confirmed to be excellent in moisture resistance.

The transparent conductive film immediately after the film formation was subjected to heat treatment as in Example 4. As a result of X-ray diffraction analysis, indium oxide crystals were observed, which confirmed the resulting film was crystalline. After the heat treatment, the specific resistance of the transparent conductive film was decreased to 195 μΩcm.

Comparative Example 1

(1) Production of Target

A sintered body was produced in the same manner as in Example 3, except that 900 g of indium oxide and 100 g of tin oxide were used.

An X-ray diffraction analysis revealed that the sintered body was formed of indium oxide of $In_2O_3$.

The dispersion state of In and Sn was observed by an EPMA measurement, and it was found that the particles of substantially uniform size were dispersed homogeneously. The relative density of the sintered body was 95%.

(2) Production of Transparent Conductive Film

A transparent conductive film was produced in the same manner as in Example 3, except that the sintered body obtained in (1) above was used as a sputtering target.

An X-ray diffraction analysis revealed that the resulting transparent conductive film was microcrystalline.

As a result of an ICP analysis, the atomic ratio was as follows: In/(In+Sn)=0.91, Sn/(In+Sn)=0.09.

The resulting transparent conductive film had a specific resistance of 860 μΩcm and a transmittance to visible light of 87.3%. The specific resistance was high of 1560 μΩcm after a 1000 hour-long humidity test at 40° C. with a relative humidity of 90%. The resulting transparent conductive film was confirmed to be inferior in moisture resistance.

The transparent conductive film immediately after the film formation was subjected to heat treatment as in Example 4. As a result of X-ray diffraction analysis, indium oxide crystals were observed, which confirmed that the resulting film was crystalline. After the heat treatment, the specific resistance of the transparent conductive film was decreased to 360 μΩcm.

TABLE 1

| | | Sputtering target | | | | |
| --- | --- | --- | --- | --- | --- | --- |
| | Starting material | Oxide constituting target | Doping element | Concentration of doping element Sn/(In + Sn + Sm) (at. %) | Sm/(In + Sm) | Density (%) |
| Example 1 | Indium Oxide 450 g Samarium Oxide 550 g | $InSmO_3$ Indium Oxide | — | — | 0.5 | 95 |
| Example 2 | Indium Oxide 850 g Samarium Oxide 150 g | $InSmO_3$ Indium Oxide | — | — | 0.12 | 95 |
| Example 3 | Indium Oxide 900 g Tin Oxide 70 g Samarium Oxide 30 g | $Sn_2Sm_2O_7$ Indium Oxide | Sn | 6.5 | 0.026 | 95 |
| Example 4 | Indium Oxide 850 g Tin Oxide 50 g Samarium Oxide 100 g | $InSmO_3$ $Sn_2Sm_2O_7$ Indium Oxide | Sn | 4.7 | 0.086 | 95 |

TABLE 1-continued

| | | Sputtering target | | | | |
|---|---|---|---|---|---|---|
| | Starting material | Oxide constituting target | Doping element | Concentration of doping element Sn/(In + Sn + Sm) (at. %) | Sm/(In + Sm) | Density (%) |
| Example 5 | Indium Oxide 900 g<br>Tin Oxide 50 g<br>Samarium Oxide 50 g | $Sn_2Sm_2O_3$<br>Indium Oxide | Sn | 4.7 | 0.042 | 95 |
| Example 6 | Indium Oxide 900 g<br>Tin Oxide 90 g<br>Samarium Oxide 10 g | $Sn_2Sm_2O_7$<br>(microcrystal)<br>Indium Oxide | Sn | 8.4 | 0.009 | 95 |
| Comparative Example 1 | Indium Oxide 900 g<br>Tin Oxide 100 g | $In_2O_3$ | Sn | 9.3 | — | 95 |

TABLE 2

| | Transparent conductive film | | | | | |
|---|---|---|---|---|---|---|
| | Properties of target | | Properties of thin film | | | |
| | Bulk resistance of target (mΩcm) | Extraordinary discharge during sputtering | Specific resistance (μΩcm) | Specific resistance after moisture resistance test (μΩcm) | Specific resistance after heat treatment (μΩcm) | Transmittance to visible rays (%) |
| Example 3 | 1.6 | None | 480 | 485 | 240 | 86.2 |
| Example 4 | 1.5 | None | 435 | 462 | 215 | 86.8 |
| Example 5 | 1.6 | None | 486 | 514 | 247 | 86.4 |
| Example 6 | 1.3 | None | 386 | 432 | 195 | 87.8 |
| Comparative Example 1 | 0.2 | Occurred | 860 | 1560 | 360 | 87.3 |

INDUSTRIAL APPLICABILITY

The target of the invention is suitable for use as a target for producing transparent conductive films for various applications such as liquid crystal display elements, EL display elements, and solar cells.

The invention claimed is:

1. A sputtering target which is formed of a sintered body comprising one or more of (a) to (c):
   (a) $InSmO_3$,
   (b) a mixture of $InSmO_3$ and $In_2O_3$, and/or
   (c) a mixture of $InSmO_3$ and $Sm_2O_3$.

2. The sputtering target according to claim 1, wherein the sintered body comprises (b) a mixture of $InSmO_3$ and $In_2O_3$.

3. The sputtering target according to claim 2, wherein the atomic ratio of In and Sm, [Sm/(In+Sm)], in the sintered body is 0.001 to 0.8.

4. The sputtering target according to claim 1, wherein the sintered body is doped with at least one element with an atomic valency of positive tetravalency or higher in an amount of 20 at. % or less relative to the total sum of all cation elements.

5. The sputtering target according to claim 4, wherein the element with an atomic valency of positive tetravalency or higher is one or more element selected from the group consisting of Sn, Ge, Ti, Zr, Hf, Nb and Ce.

6. The sputtering target according to claim 4 which is formed of a sintered body comprising an oxide comprising $InSmO_3$ and $Sn_2Sm_2O_7$.

7. A method for producing the sputtering target according to claim 4, comprising:

adding at least one compound of an element with an atomic valency of positive tetravalency or higher to an indium compound and a samarium compound to obtain a mixture;

molding the mixture to obtain a molded article; and sintering the molded article to obtain a sintered body.

8. A method for producing the sputtering target according to claim 1, comprising:

mixing an indium compound and a samarium compound to obtain a mixture;

molding the mixture to obtain a molded article; and sintering the molded article to obtain a sintered body.

9. The sputtering target according to claim 1, wherein the sintered body comprises
   (a) $InSmO_3$,
   (b) a mixture of $InSmO_3$ and $In_2O_3$, and
   (c) a mixture of $InSmO_3$ and $Sm_2O_3$.

10. The sputtering target according to claim 9, wherein the sintered body is doped with at least one element with an atomic valency of positive tetravalency or higher in an amount of 20 at. % or less relative to the total sum of all cation elements.

11. A sputtering target which is formed of a sintered body consisting of one or more of (a) to (c);
   (a) $InSmO_3$,
   (b) a mixture of $InSmO_3$ and $In_2O_3$, and/or
   (c) a mixture of $InSmO_3$ and $Sm_2O_3$, wherein said sintered body is optionally doped with at least one element with an atomic valency of positive tetravalency or higher in an amount of 20 at % or less relative to the total sum of all cation elements.

12. The sputtering target according to claim 11, wherein the sintered body is doped with at least one element with an atomic valency of positive tetravalency or higher in an amount of 20 at. % or less relative to the total sum of all cation elements.

13. The sputtering target according to claim 11, wherein the sintered body consists of (b) a mixture of $InSmO_3$ and $In_2O_3$.

14. A sputtering target which is formed of a sintered body consisting essentially of one or more of (a) to (c):

(a) $InSmO_3$,
(b) a mixture of $InSmO_3$ and $In_2O_3$, and/or
(c) a mixture of $InSmO_3$ and $Sm_2O_3$.

15. The sputtering target according to claim 14, wherein the sintered body is doped with at least one element with an atomic valency of positive tetravalency or higher in an amount of 20 at. % or less relative to the total sum of all cation elements.

16. The sputtering target according to claim 14, wherein the sintered body consists essentially of (b) a mixture of $InSmO_3$ and $In_2O_3$.

* * * * *